(12) United States Patent
Arima et al.

(10) Patent No.: US 11,346,889 B2
(45) Date of Patent: May 31, 2022

(54) CHARGE-DISCHARGE CURVE ESTIMATION DEVICE AND CHARGE-DISCHARGE CURVE ESTIMATION METHOD OF A RECHARGEABLE BATTERY

(71) Applicant: DAIWA CAN COMPANY, Tokyo (JP)

(72) Inventors: Masahito Arima, Sagamihara (JP); Naoki Oniki, Sagamihara (JP)

(73) Assignee: DAIWA CAN COMPANY, Tokyo (JP)

( * ) Notice: Subject to any disclaimer, the term of this patent is extended or adjusted under 35 U.S.C. 154(b) by 0 days.

(21) Appl. No.: 17/119,705

(22) Filed: Dec. 11, 2020

(65) Prior Publication Data

US 2021/0096189 A1  Apr. 1, 2021

Related U.S. Application Data

(63) Continuation of application No. PCT/JP2019/023712, filed on Jun. 14, 2019.

(30) Foreign Application Priority Data

Jun. 15, 2018  (JP) .............................. JP2018-115000

(51) Int. Cl.
G01R 31/367   (2019.01)
G01R 31/3842  (2019.01)
G01R 31/374   (2019.01)

(52) U.S. Cl.
CPC ......... *G01R 31/367* (2019.01); *G01R 31/374* (2019.01); *G01R 31/3842* (2019.01)

(58) Field of Classification Search
None
See application file for complete search history.

(56) References Cited

U.S. PATENT DOCUMENTS

2004/0160224 A1* 8/2004 Yamazaki ............ G01R 31/392
                                                        324/426

FOREIGN PATENT DOCUMENTS

JP    2002-131402 A    5/2002
JP    2014-044149 A    3/2014
(Continued)

OTHER PUBLICATIONS

Arima, M. et al. "An examination about economic efficiency estimation model of lithium-ion batteries," Electronic Journal "Journal of Japan Society of Energy and Resources".

(Continued)

Primary Examiner — Jas A Sanghera
(74) Attorney, Agent, or Firm — John P. White

(57) ABSTRACT

A charge-discharge estimation device derives and sets as a prior estimation function an approximate curve of an initial open-end voltage function and initial impedance function to be corrected a first time. A measurement unit measures a charge-discharge voltage and a charge-discharge current in a cycle of a predetermined time. An estimation calculation processing unit obtains an estimated error between a measured voltage and a prior estimation voltage obtained from the prior estimation function, and obtains a posterior estimation value by applying, to the calculated estimated error and a current value, a correction expression using a Gaussian function having a predetermined learning rate $L_R$ and correction width a as terms, corrects the prior estimation function based on the calculated posterior estimation value, sets a new prior estimation function, and estimates a charge-discharge curve.

2 Claims, 5 Drawing Sheets

(56) References Cited

FOREIGN PATENT DOCUMENTS

| | | |
|---|---|---|
| JP | 2015-135286 A | 7/2015 |
| JP | 2016-090346 A | 5/2016 |
| JP | 2017-220293 A | 12/2017 |
| WO | WO 2019/117198 A1 | 6/2019 |
| WO | WO 2019/240270 A1 | 12/2019 |

OTHER PUBLICATIONS

Arima, M. et al. "A method of the degradation diagnosis by the using stat of lithium-ion battery modules," IEICE Technical Report.
Arima, M. et al. "Three degradation parameters estimation of a LIB module using single indicator for in-situ charge-discharge energy prediction," IEEE International Telecommunications Energy Conference (INTELEC), Oct. 2018, DOI: 10.1109/INTLEC.2018.8612409.
International Search Report dated Aug. 27, 2019 in connection with PCT International Patent Application No. PCT/JP2019/023712.
International Preliminary Report on Patentability dated Dec. 15, 2020, including English translation of Written Opinion of the International Searching Authority dated Aug. 27, 2019, in connection with PCT International Application No. PCT/JP2019/023712.
Written Opinion of the International Searching Authority dated Aug. 27, 2019, in connection with PCT International Application No. PCT/JP2019/023712.

\* cited by examiner

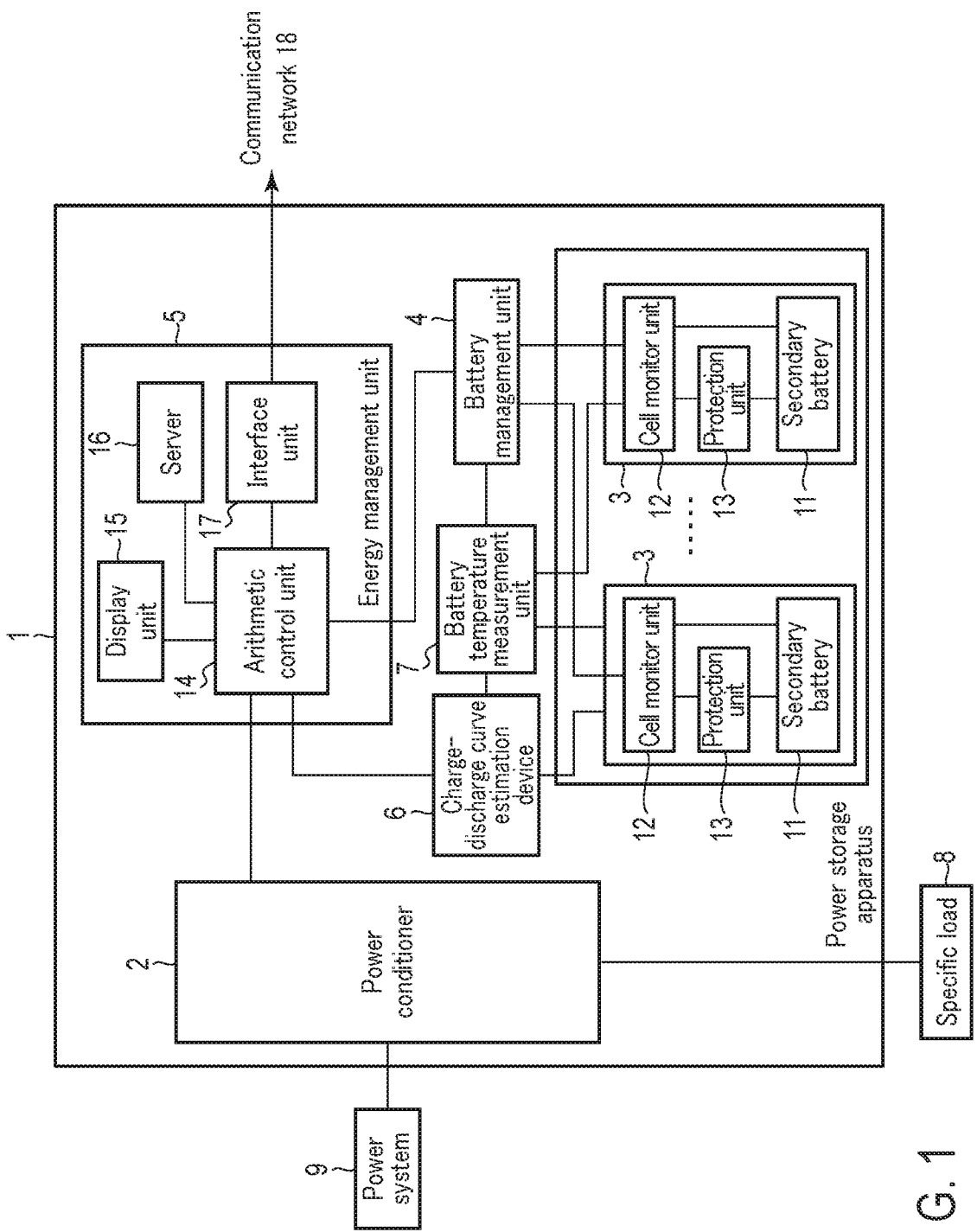
F I G. 1

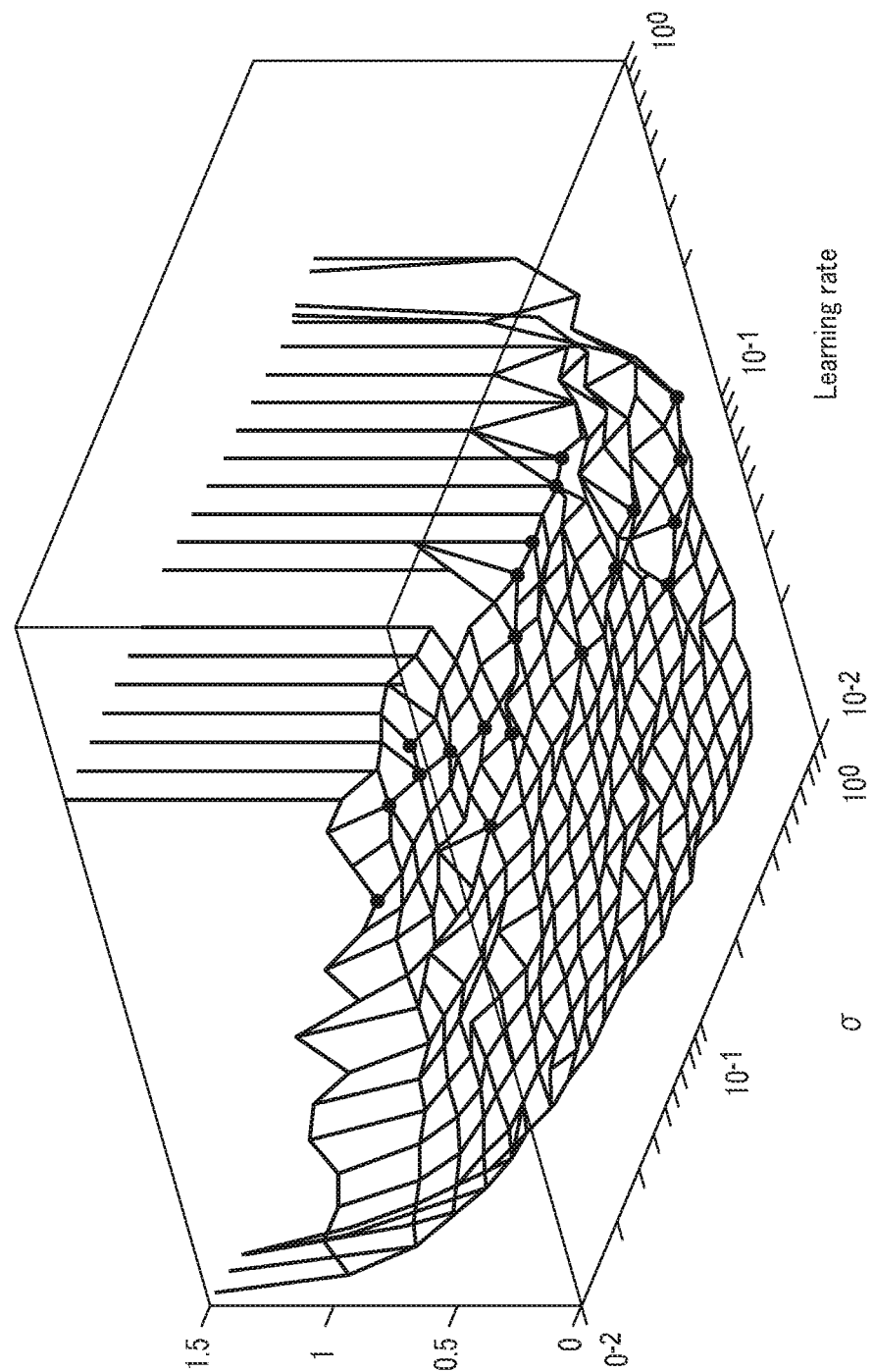
F I G. 7

CHARGE-DISCHARGE CURVE ESTIMATION DEVICE AND CHARGE-DISCHARGE CURVE ESTIMATION METHOD OF A RECHARGEABLE BATTERY

CROSS-REFERENCE TO RELATED APPLICATIONS

This application is a Continuation Application of PCT Application No. PCT/JP2019/023712, filed Jun. 14, 2019, which was published under PCT Article 21(2) in Japanese.

This application is based upon and claims the benefit of priority from prior Japanese Patent Application No. 2018-115000, filed Jun. 15, 2018 the entire contents of which are incorporated herein by reference.

FIELD

Embodiments of the present invention generally relate to a charge-discharge curve estimation device and charge-discharge curve estimation method of a rechargeable battery for estimating an economic efficiency of the rechargeable battery.

BACKGROUND

Conventionally, a lithium-ion battery included in a power storage apparatus installed in a large building structure is used for the purpose of performing peak-cutting, by which a power demand is reduced, or for the purpose of performing peak-shifting, by which nighttime power is stored for use in the daytime, or used as an emergency power supply for disaster countermeasures. A study has been done to understand the economic merits of utilizing such a stationary lithium-ion battery and optimizing the use of power when a time-of-day price is applied. In other words, the economic merits are obtained by an operation in which the rechargeable battery is charged in a time zone with a low electricity price and discharged in a time zone with a high electricity price. Since the economic merits in this case are determined by the amount of power as measured in a trading unit of power, the charge power amount and charge-discharge efficiency have direct influence on the economic merits. Accordingly, the management of a degradation state of lithium-ion batteries has been an important matter of concern, and methods for ascertaining the degradation state have been proposed.

SUMMARY

For example, Patent Literature 1 (Jpn. Pat. Appln. KOKAI Publication No. 2014-044149) proposes a remaining-capacity estimation method utilizing the relationship between impedances and discharge capacities at a plurality of frequencies, without measuring discharge capacities. Patent Literature 2 (Jpn. Pat. Appln. KOKAI Publication No. 2002-131402) proposes a measuring method of discharging a fully charged lithium-ion battery and estimating a remaining capacity of the battery by using a difference between discharge voltages measured at two points in time after the passage of a predetermined time from the start of the discharge. These methods can estimate a remaining capacity, but cannot estimate a charge-discharge curve itself; therefore, the methods are not sufficient for management of the degradation state.

On the other hand, Patent Literature 3 (Jpn. Pat. Appln. KOKAI Publication No. 2017-220293) proposes a method and an apparatus for estimating a charge-discharge curve of a secondary battery by using a differential voltage between a discharge voltage and a charge upper limit voltage obtained in advance. According to Patent Literature 3, a charge-discharge curve can be estimated; however, since the estimation is possible only for a specific current rate of charge-discharge current, estimation needs to be performed again when the current rate is changed.

According to an embodiment of the present invention, there is provided a charge-discharge curve estimation device comprising: an initial function derivation unit configured to derive and set as a prior estimation function an approximate curve of an initial open-end voltage function and initial impedance function to be corrected a first time; a charge unit configured to detect a charge state of a secondary battery and charge the secondary battery within a range up to a predetermined charge upper limit voltage; a discharge unit configured to electrically connect a load to the secondary battery and cause the secondary battery to discharge power; a measurement unit configured to measure a charge-discharge voltage and a charge-discharge current in a cycle of a predetermined time from a start of charging or discharging by the charge unit or the discharge unit; an SOC calculation unit configured to calculate an SOC value simultaneously with the measurement of the charge-discharge voltage; and an estimation calculation processing unit configured to obtain an estimated error between a measured voltage and a prior estimation voltage obtained from the prior estimation function, and obtain, based on the calculated estimated error and the current value, a posterior estimation value by correcting an open-end voltage and an impedance value in accordance with a correction expression using a Gaussian function having a predetermined learning rate $L_R$ and correction width a as terms, correct the prior estimation function based on the calculated posterior estimation value, set a new prior estimation function, and estimate a charge-discharge curve.

Further, according to an embodiment of the present invention, there is provided a charge-discharge curve estimation method comprising: performing initial function derivation processing of deriving and setting as a prior estimation function an appropriate curve of an initial open-end voltage function OCV(SOC) and initial impedance function Z(SOC) to be corrected a first time; performing stabilization processing of causing a battery temperature to agree with an ambient temperature; performing charge-discharge processing of discharging to a discharge lower limit voltage or charging to a charge upper limit voltage, the charge-discharge processing being performed after the stabilization processing; performing measurement processing of measuring, during the charge-discharge processing, a charge-discharge voltage $V_{meas}$ and a charge-discharge current I (defined as positive during charging and negative during discharging) in a cycle of a predetermined time and simultaneously calculating an SOC value (charging rate); performing voltage prior estimation processing of obtaining a prior estimation voltage value $\hat{V}^-(SOC)$ in accordance with the prior estimation function, based on the current value I and the SOC value, the voltage prior estimation processing being performed after the measurement processing; performing estimated error calculation processing of obtaining an estimated error $\tilde{V}$ between the measured voltage $V_{meas}$ and the prior estimation voltage value $\hat{V}^-(SOC)$; performing, based on the calculated error and the current value, posterior estimation calculation processing of obtaining as a posterior estimation value a posterior estimation open-end voltage value $\overline{OCV}$(SOC) and a posterior estimation impedance value $\hat{Z}$(SOC) by correcting an open-end voltage value and an impedance value in accordance with correction expressions (1) and (2) using a Gaussian function with a predetermined learning rate $L_R$ and correction width $\sigma$ $$\overline{OCV}(SOC) = \overline{OCV}^-(SOC) + \tilde{V}L_R\exp\left\{-\frac{(SOC-\mu)^2}{2\sigma^2}\right\} \quad (1)$$

$$\hat{Z}(SOC) = \hat{Z}^-(SOC) + \frac{\tilde{V}}{I}L_R\exp\left\{-\frac{(SOC-\mu)^2}{2\sigma^2}\right\}, \quad (2)$$

where $\mu$ is a corrected peak top position of the Gaussian function and is an SOC value of a time when the measured voltage $V_{meas}$ is obtained; performing, based on the calculated posterior estimation value, posterior estimation approximate curve derivation processing of deriving a posterior estimation approximate curve of a new open-end voltage function and impedance function; and machine learning processing of setting the posterior estimation approximate curve as a new prior estimation function, repeating the measurement processing and the machine learning processing a predetermined number of times; and estimating a charge-discharge curve in accordance with $V(SOC)=OCV(SOC)+IZ(SOC)$ from the obtained approximate curve of the open-end voltage function and impedance function.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing a configuration of a power storage system including a charge-discharge curve estimation device of a rechargeable battery according to an embodiment.

FIG. 7 is a diagram showing an average error of a charge-discharge curve estimation result of the present embodiment.

DETAILED DESCRIPTION

Figure 2:
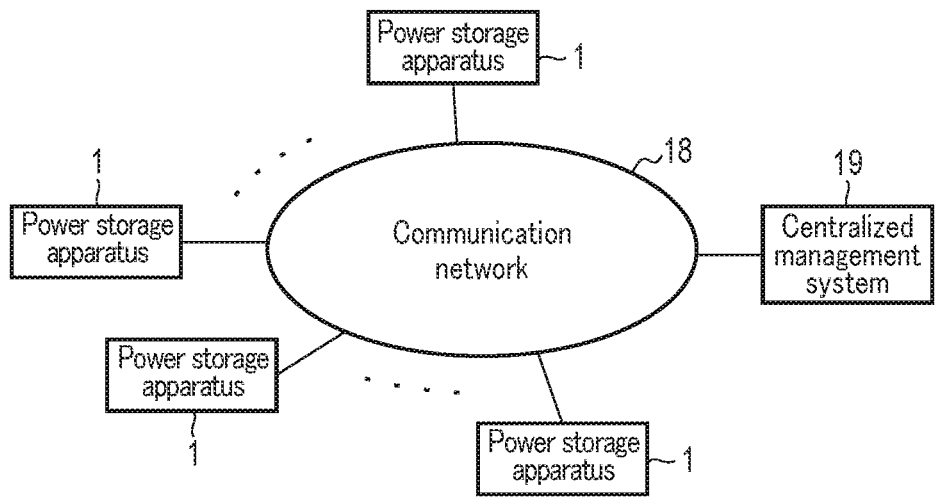
FIG. 2 is a diagram showing a configuration example of a power storage system in which a plurality of power storage apparatuses perform network communication.

Hereinafter, a charge-discharge curve estimation device and charge-discharge curve estimation method of a rechargeable battery according to an embodiment of the present invention will be described with reference to the accompanying drawings.

FIG. 1 shows a configuration of a power storage apparatus including a charge-discharge curve estimation device of a rechargeable battery according to the present embodiment. The power storage apparatus 1 mainly includes a power conditioner (power conditioning system) 2, a battery module 3, a battery management unit (BMU) 4, an energy management unit (EMU) or energy management system (EMS) 5, a charge-discharge curve estimation device 6, and a battery temperature measurement unit 7. Although not shown, component parts included in an ordinary power storage apparatus are included in the power storage apparatus of the present embodiment, and a detailed description of such parts is omitted.

The power conditioner 2 functions as a so-called converter which converts power supplied from a power system 9 of an external electric power company or the like, power supplied from a solar power generation system, or power supplied from the battery module 3 to power that can be utilized by an electric drive device including a specific load 8. Further, the power conditioner 2 may have a function of a charger which charges a rechargeable battery. For example, when the specific load 8 is an electric device driven by AC power, DC power supplied from the battery module 3 is converted to the power form of AC power. Depending on the electric device of the specific load 8, the voltage value of power may be increased. The power conditioner 2 can not only supply power to the specific load 8, but also cause the battery module 3 to discharge energy stored therein and reduce the consumption of power supplied from the power system 9 when the consumption of power supplied from the power system 9 is maximum. In this case, when a power demand lowers, for example, in the middle of the night, the battery module 3 after discharging can be fully charged through the power conditioner 2.

A device to which power is to be supplied when the power supply from the power system 9 is stopped (e.g., at the time of power outage) is assumed as the specific load 8 to which power is supplied by the power storage apparatus 1, an example of which is an electronic device such as a computer, or a communication device. The specific load 8 is, for example, an electronic device such as a computer, or a communication device, and power supply for power source backup is performed for the specific load 8.

The battery module 3 includes a secondary battery (rechargeable battery) 11 which outputs DC voltage, a cell monitor unit (CMU) 12, and a protection unit 13. The number of battery modules 3 is set appropriately according to the design relating to the amount of power supplied to a specific load or the like. For example, when a large-capacity secondary battery is formed, a plurality of battery modules 3 may be electrically connected to form a single battery pack. In the present embodiment, a lithium-ion battery is described as an example of the secondary battery 11 for which charge-discharge curve estimation is performed. However, the embodiment is not limited to this, and can easily be applied to a battery with a different configuration as long as the battery has a low memory effect and good self-discharge characteristics, like a lithium-ion battery. For example, the secondary battery 11 can also be applied to a nanowire battery or the like, which is an improvement on lithium-ion batteries.

The secondary battery 11 of the present embodiment is not limited with respect to not only the inner battery material (e.g., an electrode material) or the cell structure, but also the form of the exterior member. The secondary battery 11 may be of a cylindrical canister type, a rectangular canister type, and a laminate type. Regarding the connection mode of the secondary battery 11 constituting the battery module 3, a publicly known connection mode, such as a single battery mode, a serial coupled battery mode, or a parallel coupled battery mode is applicable.

The battery temperature measurement unit 7 measures the temperature with a temperature sensor (not shown) disposed in contact with each secondary battery 11. The ambient temperature, at which the lithium-ion battery can be used, in the apparatus is in the range of about 5 to 40° C.; however, if necessary, a battery temperature adjustment mechanism can be provided in the apparatus, depending on the environment of installation (cold region or tropical region). The battery temperature adjustment mechanism is constituted by a fan and a heater for performing temperature adjustment. When the temperature measured by the battery temperature measurement unit 7 has exceeded the upper limit or fallen below the lower limit of a preset temperature range, the fan and heater perform temperature adjustment to the above-mentioned temperature range (about 5 to 40° C.) at which the secondary battery 11 can be used, so as to prevent the battery performance from lowering. Needless to say, if the range of temperature at which the secondary battery 11 can be used increases due to future battery improvement, the temperature adjustment mechanism can adapt to the increased temperature range.

The cell monitor unit 12 continuously measures the output voltage, current, and temperature of each secondary battery 11 of a single battery (or single cell), and transmits the measurement result to the battery management unit 4. In particular, the cell monitor unit 12 measures a charge-discharge voltage $V_{meas}$ every prescribed period of time during charge-discharge processing for charge-discharge curve estimation, in accordance with the control of an arithmetic control unit 14 to be described later.

Furthermore, the cell monitor unit 12 transmits the output voltage, current, and temperature acquired from the secondary battery 11 to the battery management unit 4 as monitor information. Based on the received monitor information, the battery management unit 4 judges whether or not an abnormality, such as an overcharge, an overdischarge, or a temperature rise, has occurred. When judging that an abnormality has occurred, the battery management unit 4 controls the protection unit 13 and stops the charge or output (discharge) for the secondary battery 11, thereby preventing overcharge or overdischarge. Note that, when an emergent abnormality occurs due to a failure or the like of the secondary battery 11, the protection unit 13 stops the charge or output (discharge) for the secondary battery 11 by electrical shutoff.

Further, the protection unit 13 may be provided with a function of reporting an abnormality to the battery management unit 4 to avoid risk. The judgment as to an occurrence of an abnormality is indispensable; however, the judgment function may be provided in either the cell monitor unit 12 on the battery module 3 side or the battery management unit 4 on the power storage apparatus 1 side, or both, for enhanced safety by double judgment. In the double judgment, the order of judgments is determined in advance and, for example, the cell monitor unit 12 performs a first judgment as to occurrence of an abnormality and then the battery management unit 4 performs a second judgment as to occurrence of an abnormality. As the judgment procedure taken at this time, the protection unit 13 executes a protection operation when one of the two judgment units judges that an abnormality has occurred. It is also possible to execute the protection operation by the protection unit 13 only when both of the judgment units judge that an abnormality has occurred, and issue a warning when one of them judges that an abnormality has occurred, although this depends on the design concept.

In addition, the battery management unit 4 centrally aggregates monitor information transmitted from the cell monitor units 12 of the battery modules 3, and sends the monitor information to the energy management unit 5 at an upper level. Based on the monitor information, the energy management unit 5 instructs the power conditioner 2 to charge and discharge the battery modules 3. In accordance with the instruction, the power conditioner 2 controls charging and discharging of the battery modules 3.

The energy management unit 5 includes an arithmetic control unit 14, a display unit 15, a server 16, and an interface unit 17.

The arithmetic control unit 14 has a function equivalent to that of an arithmetic processor or the like of a computer, and instructs the battery management unit 4 to charge and discharge the battery modules 3, and instructs the power conditioner 2 to charge and discharge the battery modules 3. In addition, a charge upper limit voltage value and a discharge lower limit voltage value are preset for each of the battery modules 3, and the arithmetic control unit 14 provides instructions to stop charging or stop discharging on the basis of the monitor information transmitted from the battery management unit 4.

The display unit 15 is constituted by, for example, a liquid crystal display unit, and displays, by the control of the arithmetic control unit 14, the operation state of the power storage apparatus 1, the remaining capacity or the like of the battery modules 3 (secondary batteries 11), and warnings. The display unit 15 may also be used as an input device by adopting a touch panel or the like.

The server 16 stores as needed in an accumulating manner the latest information on the operation state of the power storage apparatus 1, the monitor information relating to the battery modules 3 or the like, the information relating to a charge-discharge curve, and the like, which have been transmitted to the energy management unit 5. As shown in FIG. 2, the interface unit 17 communicates with a centralized management system 19, which is installed outside, via a communication network 18 such as the Internet.

Figure 3:
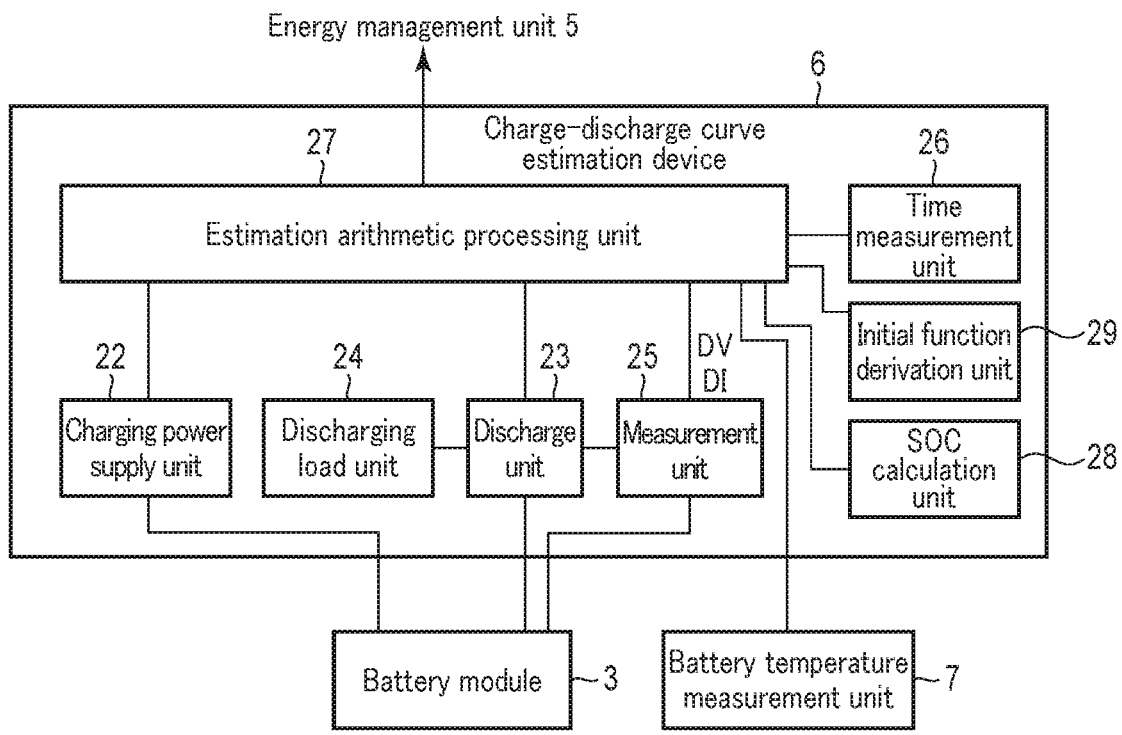
FIG. 3 is a block diagram showing a configuration example of the charge-discharge curve estimation device of the rechargeable battery.

Next, the charge-discharge curve estimation device 6 of the rechargeable battery will be described. FIG. 3 shows a configuration example of the charge-discharge curve estimation device 6 of the rechargeable battery.

The charge-discharge curve estimation device 6 includes a charging power supply unit 22, a discharge unit 23, a discharging load unit 24, a measurement unit 25, a time measurement unit 26, an estimation arithmetic processing unit 27, an SOC calculation unit 28, and an initial function derivation unit 29. The charge-discharge curve estimation device 6 estimates a charge-discharge curve of the secondary battery 11 in the battery module 3. The estimated charge-discharge curve of each secondary battery 11 is stored in the server 16.

The charging power supply unit 22 outputs a DC voltage that complies with the rating of the secondary battery 11 to the secondary battery 11, and fully charges the secondary battery 11. The charging power supply unit 22 is provided as a power supply dedicated to estimate the charge-discharge curve of the secondary battery 11. However, a battery charging power supply unit, which is usually provided in the power storage apparatus or the power conditioner 2, may be used as the charging power supply unit 22.

The discharge unit 23 is accompanied by the discharging load unit 24, and electrically connects the secondary battery 11 and the discharging load unit 24 through a switch operation (not shown) and causes the secondary battery 11 to discharge a predetermined amount of power (assumed here is a constant current or a constant voltage). The discharging load unit 24 may be a resistor or an electronic load. Instead of providing such an exclusive load, it is also possible to cause the power system to perform regeneration while simulating the load.

The measurement unit 25 measures a DC voltage and DC current output by the battery module 3 (secondary battery 11). The DC voltage and the DC current output from the battery module 3 are periodically measured every time a predetermined period of time elapses. Instead of actually measuring the voltage and current, it is also possible to use the voltage value and current value included in the monitor information transmitted from the battery management unit 4 and stored in the server 16 of the energy management unit 5. The time measurement unit 26 is a timer for measuring a period of time during which power is discharged from the battery module 3, and measures measurement timing.

The SOC calculation unit 28 calculates a State of Charge (SOC) value (charging rate) at the time when the measurement unit 25 measures the voltage. The SOC value is a value obtained by dividing the charge current amount Qc [Ah] by the full charge capacity FCC [Ah] at that time. The SOC value can be calculated by an appropriate method such as a current integration method, a voltage method, or optimization filtering. The FCC value (full charge capacity) can be calculated by an appropriate method such as a charge-discharge differential voltage method, an AC impedance method, a discharge curve differentiation method, or optimization filtering.

The initial function derivation unit 29 derives an approximate curve of an open-end voltage function and initial impedance function to be corrected a first time, and sets the approximate curve as a prior estimation function. Various curve fitting methods can be adopted to obtain the approximate curve, and an approximate curve obtained in advance can be stored and set as a prior estimation function.

The estimation arithmetic processing unit 27 is an arithmetic processing unit (such as a CPU) that stores an arithmetic algorithm using a relational expression to be described later, and estimates a charge-discharge curve on the basis of the obtained measurement values of the secondary battery 11. The estimation arithmetic processing unit 27 is not necessarily dedicatedly provided in the charge-discharge curve estimation device 6 of the rechargeable battery, and may be substituted for by the arithmetic control unit 14 of the energy management unit 5 to execute the processing function.

As shown in FIG. 1, the battery module 3 includes the secondary battery (rechargeable battery) 11 which outputs DC voltage, the cell monitor unit 12, and the protection unit 13. The number of battery modules 3 is set appropriately according to the design relating to the power supply amount of the specific load or the like and, when a large-capacity secondary battery is formed, a plurality of battery modules 3 may be electrically connected to form a single battery pack.

In the present embodiment, a lithium-ion battery is described as an example of the secondary battery 11 for which economic efficiency is estimated; however, the secondary battery 11 is not limited to a lithium-ion battery. That is, the embodiment is easily applicable to a battery with a different configuration as long as the battery has a low memory effect and good self-discharge characteristics, like a lithium-ion battery. For example, the embodiment can also be applied to a nanowire battery or the like, which is an improvement on lithium-ion batteries.

Figure 4:
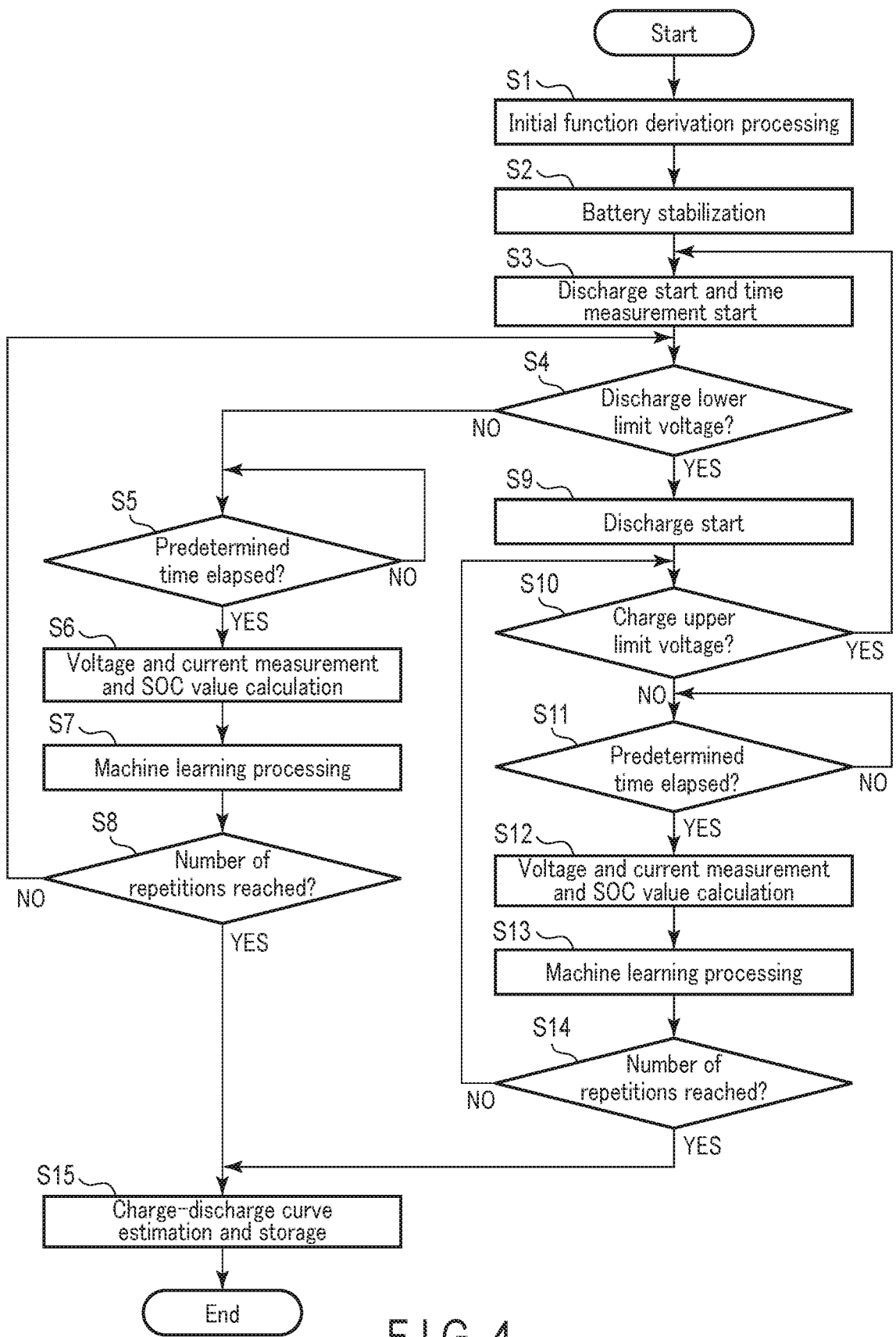
FIG. 4 is a flowchart for illustrating a charge-discharge curve estimation method by the charge-discharge curve estimation device of the rechargeable battery.

Next, a charge-discharge curve estimation method by the charge-discharge curve estimation device of the present embodiment will be described with reference to the flowchart of FIG. 4.

First, initial function derivation processing is performed (step S1). Specifically, an approximate curve of an initial open-end voltage function OCV(SOC) and initial impedance function Z(SOC) to be corrected a first time are derived. For derivation of the approximate curve, a known approximating method of a charge-discharge curve can be used. For example, after a charge-discharge test is performed on the battery module 3 in advance, a charge-discharge voltage value and a current value in one charge-discharge cycle are measured. An approximate curve is obtained from the charge-discharge voltage value and current value and stored. The approximate curve of the initial open-end voltage function OCV(SOC) and initial impedance function Z(SOC) obtained in accordance with the following expression of the charge-discharge curve, the open-end voltage, and impedance functions is set as a prior estimation function, and is used in machine learning processing to be described later:

$$V(SOC)=OCV(SOC)+IZ(SOC)$$

Next, the battery temperature measurement unit 7 measures the temperature of the secondary battery 11, and battery stabilization processing to leave the battery until the battery temperature agrees with the ambient temperature is performed (step S2). In this battery stabilization processing, the time required before the temperature of the secondary battery 11 agrees with the ambient temperature is not always the same, and varies depending on the type of the secondary battery 11. In addition, the stabilization processing time needs to be longer than the time required for the transient response to converge after completion of charging, and is several tens of minutes or more in general.

Thereafter, the discharge unit 23 electrically connects the secondary battery 11 to the discharging load unit 24 and starts discharging, and the time measurement unit 26 starts timing (step S3). In the present embodiment, discharging is started first, but charging may be started first. After discharging is started, whether or not the voltage has reached a discharge lower limit voltage is judged (step S4). When the voltage is judged to have reached the discharge lower limit voltage in the judgment of step S4 (YES), charging is started (step S9). On the other hand, when the voltage is judged to not have reached the discharge lower limit voltage (NO), discharging is continued. For the discharging method, a constant current or a constant power can be selected. After discharging is started, whether or not a prescribed period of time to be described later has elapsed is judged (step S5). Discharging is continued until the prescribed period of time is judged to have elapsed in the judgment of step S5 (NO), and when the prescribed period of time is judged to have elapsed (YES), the measurement unit 25 measures the discharge voltage $V_{meas}$ and charge-discharge current I of the secondary battery 11, and the SOC calculation unit 28 calculates the SOC value (step S6).

After the measurement of the discharge voltage and discharge current and the calculation of the SOC value are completed, machine learning processing is performed (step S7). In the machine learning processing, a prior estimation value is calculated in accordance with a relational expression to be described later on the basis of a prior estimation function and a measured value. The prior estimation value is corrected based on an estimated error and a Gaussian function to obtain a posterior estimation value, and a posterior estimation approximate curve is obtained based on the posterior estimation value. In such machine learning processing, the accuracy of the approximate curve can be improved by repeating setting of the obtained posterior estimation approximate curve as a new prior estimation function and correction of the prior estimation function.

Figure 5:
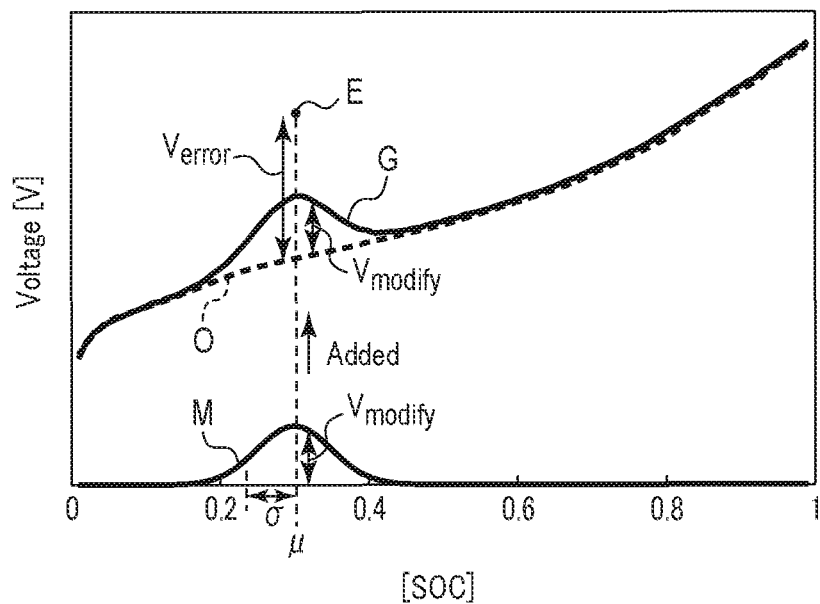
FIG. 5 is a diagram conceptually showing an approximate curve of an open-end voltage OCV to be corrected.

For example, FIG. 5 conceptually shows an approximate curve of the open-end voltage OCV to be corrected. There is a voltage difference $V_{error}$ between a measured voltage value E and the initial open-end voltage curve (prior estimated value) O shown in FIG. 5. To eliminate the error due to the voltage difference $V_{error}$, a correction voltage $V_{modify}$ is calculated from a Gaussian free-form deformation (GFFD) curve obtained by an estimated error value based on the voltage difference $V_{error}$ and a Gaussian function. The correction voltage $V_{modify}$ is superimposed on the initial open-end voltage curve O to obtain a posterior estimation approximate curve G. As will be described later, the correction voltage $V_{modify}$ does not make a correction by adding (or subtracting) the voltage difference $V_{error}$ at a single time, but repeats a correction a plurality of times to improve the accuracy of the posterior estimation approximate curve G. Although one measured positive voltage E is shown in FIG. 5 for ease of explanation, the approximate curve is actually corrected using positive and negative voltage values (with respect to the prior estimation values) measured at times of a plurality of charging rates (SOCs).

Next, whether or not the number of repeated corrections has reached a predetermined number of repetitions is judged (step S8). If the number of corrections is judged to not have reached the predetermined number of repetitions in this judgement (NO), the processing returns to step S4, and discharging is continued. When discharging is continued, whether or not the voltage has reached the discharge lower limit voltage is judged again (step S4), and when the voltage is judged to not have reached the discharge lower limit voltage (NO), the processing routine from step S4 to step S8 is repeated. When the number of corrections is judged to have reached the predetermined number of repetitions in the judgment of step S8 (YES), the charge-discharge curve is estimated in accordance with the relational expression with the voltage on the basis of the approximate curve of the open-end voltage function and the impedance function. The estimated charge-discharge curve is stored in the server 16 of the energy management unit 5 (step S15).

When the voltage is judged to have reached the discharge lower limit voltage in step S4 (YES), charging is started (step S9). After charging is started, whether or not the voltage has reached the charge upper limit voltage is judged (step S10). When the voltage is judged to not have reached the charge upper limit voltage in the judgment of step S10 (NO), whether or not a prescribed period of time has elapsed is judged (step S11), and when the voltage is judged to have reached the charge upper limit voltage (YES), the processing returns to step S3.

After the prescribed time is judged to have elapsed in the judgment of step S11 (YES), and after the charge voltage and charge current are measured and the SOC value is calculated (step S12), machine learning processing is performed (step S13).

Subsequently, whether or not the number of repetitions of machine learning processing has reached a predetermined number is judged (step S14). When the number of repetitions of machine learning processing is judged to not have reached the predetermined number of repetitions in the judgment of step S14 (NO), the processing returns to step S10, and charging is continued. Here, when charging is continued, whether or not the voltage has reached the charge upper limit voltage is judged in step S10, and when the voltage is judged to not have reached the charge upper limit voltage, and the number of repetitions of machine learning processing is judged to not have reached the predetermined number of repetitions in the judgment of step S14, the processing routine from step S10 to step S14 is repeated.

When the number of repetitions of machine learning processing is judged to have reached the predetermined number of repetitions in the judgment of step S14 (YES), the processing proceeds to step S15, and the charge-discharge curve is estimated in accordance with the relational expression with the voltage on the basis of the approximate curve of the open-end voltage function and the impedance function. The estimated charge-discharge curve is stored in the server 16 of the energy management unit 5. The stored charge-discharge curve is read from the server 16 in response to a request, and can be displayed on the display unit or used for calculation of the charge-discharge power amount.

Note that, in the charge-discharge curve estimation processing, the charge-discharge processing, the battery temperature stabilization, or the voltage and current measurement performed at the time of the charge-discharge processing may be performed on a single battery. The single battery may be a single battery included in a plurality of single batteries connected in parallel or in series in an assembled battery unit. Besides, the charge-discharge processing or the voltage and current measurement at the time of the battery temperature stabilization may be performed on an assembled battery unit in which single batteries are connected in parallel or in series. The assembled battery unit may be an assembled battery unit included in a plurality of assembled battery units connected in parallel or in series as a battery unit of a power storage system.

The prescribed period of time during which the charge-discharge voltage is measured in step S5 and step S11 is now described.

Discharging is started by the discharge unit 23 electrically connecting the battery module 3 to the discharging load unit 24. In the present embodiment, a measured value is obtained every time a fixed period of time elapses from the start of discharging. This fixed period of time needs to be a period of time such that the charging rate SOC does not greatly vary, and is approximately several tens of seconds (e.g., 10 seconds to 80 seconds).

In the present embodiment, the range of the prescribed period of time is set based on the study on measurement results obtained in advance. Here, the range of the prescribed period of time during which the discharge voltage is measured from the start of discharging is set to, for example, 10 seconds to 80 seconds. If this waiting period of time is shorter than 10 seconds, the amount of data may become so large that the time required for the processing to obtain the approximate curve increases. On the other hand, if the waiting period of time is longer than 80 seconds, the amount of data may become so small that the accuracy of the estimated charge-discharge curve decreases. This range of the prescribed period of time is merely an example, and is variable when the apparatus configuration or measurement characteristics are different, and is not strictly limited.

In the present embodiment, the prescribed period of time is set to, for example, 60 seconds, and the measured value of the secondary battery 11 is obtained in a cycle of the prescribed time.

Next, the machine learning processing of the present embodiment in the aforementioned steps S7 and S13 will be described.

First, an approximate curve of the initial open-end voltage function OCV(SOC) and initial impedance function IZ(SOC) to be corrected a first time is derived. The approximate curve may be derived using a known method, and may be approximated by a high-order polynomial or a function other than a polynomial. For example, the approximate curve of the initial open-end voltage function and initial impedance function can be derived by acquiring a charge-discharge voltage and current value of one cycle. Various curve fitting techniques can be applied to obtain the approximate curve. For example, when the function of the approximate curve is obtained by polynomial regression analysis using twelfth-order polynomial functions, the initial open-end voltage function OCV(SOC) and the initial impedance function IZ(SOC) are expressed by the following expressions using ai and bi as coefficients of respective terms of the polynomials:

$$OCV(SOC) = \sum_{i=0}^{12} a_i SOC^i$$

$$Z(SOC) = \sum_{i=0}^{12} b_i SOC^i$$

Based on these, the charge-discharge voltage V can be obtained by the following relational expression:

$$V(SOC) = OCV(SOC) + IZ(SOC)$$

Here, I is a charge-discharge current, and is defined as positive during charging and negative during discharging. The accuracy of approximation is enhanced by repeating a correction on such an approximate curve of the initial open-end voltage function OCV(SOC) and initial impedance function Z(SOC).

The approximate curve of the initial open-end voltage function OCV(SOC) and initial impedance function Z(SOC) is set as a prior estimation function. The calculated SOC value is substituted into the prior estimation function to calculate the OCV value and the impedance value. Further, by using the measured current value, the prior estimation value of the charge-discharge voltage value $\hat{V}^-(SOC)$ is calculated, and an estimated error $\tilde{V}$ is calculated in accordance with the relational expression $$V_{meas} = \hat{V}^-(SOC) + \tilde{V}$$

of the prior estimation value $\hat{V}^-(SOC)$, the measured value $V_{meas}$, and the estimated error $\tilde{V}$. Then, posterior estimation values $$\widehat{OCV}(SOC), \hat{Z}(SOC)$$

are obtained by correction expressions using a Gaussian function including a predetermined learning rate $L_R$ and a correction width $\sigma$ as terms.

$$\widehat{OCV}(SOC) = \widehat{OCV}^-(SOC) + \tilde{V} L_R \exp\left\{-\frac{(SOC-\mu)^2}{2\sigma^2}\right\}$$

$$\hat{Z}(SOC) = \hat{Z}^-(SOC) + \frac{\tilde{V}}{I} L_R \exp\left\{-\frac{(SOC-\mu)^2}{2\sigma^2}\right\}$$

The Gaussian function will now be described.

$$L_R \exp\left\{-\frac{(SOC-\mu)^2}{2\sigma^2}\right\}$$

Figure 6:
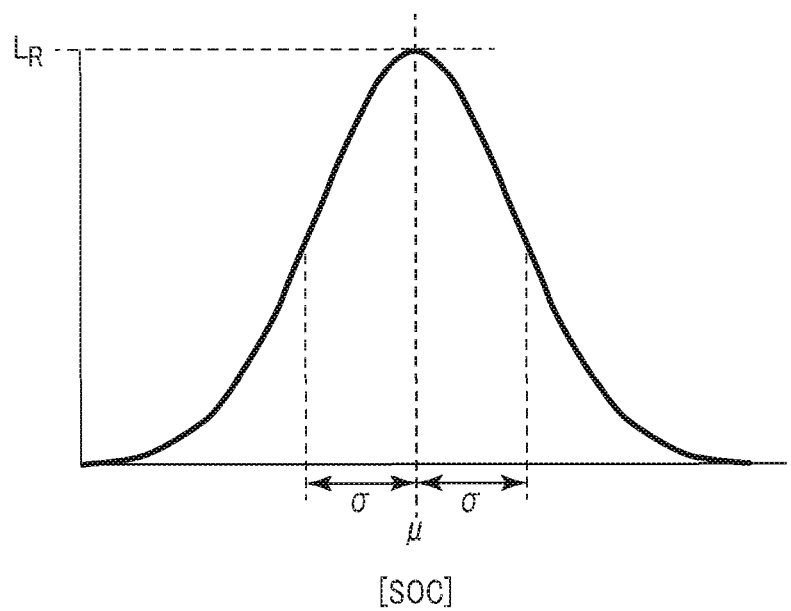
FIG. 6 is a diagram showing a Gaussian function.

Here, $L_R$ is a learning rate and is a value indicated by the peak top of the graph of the Gaussian function shown in FIG. 6. $\mu$ is an SOC value indicating the peak top, and is an SOC value when the measured value is obtained. Although $L_R$ can be discretionarily determined, it is preferably in the range represented by the following expression:

$$0.0005 \leq L_R \leq 0.05.$$

When $L_R$ is outside this range, the solution may not converge, but diverge.

The correction width $\sigma$ corresponds to the standard deviation of the Gaussian function, and the range of $\pm\sigma$ occupies about 68.3% of the area with its center positioned at the peak top of the mountain-shaped graph. In other words, the width covering about 68.3% of the correction amount by the Gaussian function is $\pm\sigma$. This value can be set discretionarily, but is preferably $0.002 \leq \sigma \leq 0.2$. If $\sigma$ is outside this range, the solution may not converge, but diverge.

Accordingly, the correction value by the Gaussian function is discrete data corresponding to the SOCs over a correction width (a region up to $\pm 3\sigma$ covering a correction amount of approximately 99.7%) centered on the peak top position $\mu$. By fitting the functions of the open-end voltage OCV and the impedance Z based on the posterior estimation value, a posterior estimation approximate curve of the OCV and impedance Z is obtained. By using the Gaussian function, a smooth approximate function can be obtained with respect to the change in the SOC.

In the present embodiment, polynomial regression analysis is used in which the initial open-end voltage function OCV(SOC) and initial impedance function Z(SOC) to be corrected a first time are approximated by twelfth order polynomials.

In the present embodiment, a charge-discharge test was conducted by a constant power method using a constant power of 1085 W with a lithium-ion battery 8-series module having a rated capacity of 50 Ah and a rated voltage of 29.6 V. An interval of 1.5 hours was provided between charging and discharging. In the measurement, the voltage of each cell (0.001 V resolution), the inter-cell temperature of every two cells (0.1° C. resolution), and the current following through the entire module (0.001 A resolution) were measured with a 1-sec time resolution.

Here, from the obtained values of the charge voltage Vpc, the discharge voltage Vpd, and current I, and the corresponding SOC value, on the basis of the relational expression of the charge-discharge voltage V $$V(SOC) = OCV(SOC) + IZ(SOC)$$

the corresponding open-end voltage value and impedance value are obtained, and the obtained data is approximated by twelfth-order polynomials so that an approximate curve is obtained.

In the present embodiment, an approximate equation of twelfth-order polynomial functions is obtained by the polynomial regression analysis, but the approximate curve can be obtained by performing curve fitting using an appropriate method.

An example of the charge-discharge curve estimation result according to the present embodiment is shown in FIG. 7. FIG. 7 shows an average value of errors (error average) of a charge-discharge curve with respect to the measured values, the charge-discharge curve being obtained by changing the correction width σ from 0.01 to 1 and changing the learning rate $L_R$ from 0.01 to 1 for each value of σ. For each σ, the $L_R$ with the smallest error average is indicated by a dot. The position with the smallest error average was the point σ=0.158 and the learning rate $L_R$=0.251.

According to the present embodiment, it is possible to estimate a charge-discharge curve with high accuracy. Further, since the charge-discharge curve is estimated from the approximate curve of the open-end voltage and impedance, it is possible to estimate a charge-discharge curve that is applicable even when the current rate changes. The estimated charge-discharge curve can be used for various purposes such as calculation of the charge-discharge energy E and evaluation of the economic efficiency of a storage battery. The charge-discharge energy E can be calculated in accordance with the following expression, where FCC is a full charge capacity, V(SOC) is a charge-discharge voltage, and SOC is a charging rate:

$$E = FCC \int_0^i V(SOC) dSOC$$

According to the present invention, a charge-discharge curve can be obtained by the open-end voltage function and the impedance function; therefore, the charge-discharge curve is applicable regardless of the current rate.

The present invention is not limited to the above-described embodiments, and can be modified in practice, without departing from the gist of the invention. In addition, embodiments may be combined as appropriate where possible, in which case a combined advantage can be attained. Furthermore, the above-described embodiments include various stages of the invention, and various inventions can be extracted by suitably combining structural elements disclosed herein.

The invention claimed is:

1. A charge-discharge curve estimation device comprising:
    an initial function derivation unit configured to derive and set as a prior estimation function an approximate curve of an initial open-end voltage function and initial impedance function to be corrected a first time;
    a charge unit configured to detect a charge state of a secondary battery and charge the secondary battery within a range up to a predetermined charge upper limit voltage;
    a discharge unit configured to electrically connect a load to the secondary battery and cause the secondary battery to discharge power;
    a measurement unit configured to measure a charge-discharge voltage and a charge-discharge current in a cycle of a predetermined time from a start of charging or discharging by the charge unit or the discharge unit;
    an SOC calculation unit configured to calculate an SOC value simultaneously with the measurement of the charge-discharge voltage; and
    an estimation calculation processing unit configured to obtain an estimated error between a measured voltage and a prior estimation voltage obtained from the prior estimation function, and obtain, based on the calculated estimated error and the current value, a posterior estimation value by correcting an open-end voltage and an impedance value in accordance with a correction expression using a Gaussian function having a predetermined learning rate $L_R$ and correction width a as terms, correct the prior estimation function based on the calculated posterior estimation value, set a new prior estimation function, and estimate a charge-discharge curve.

2. A charge-discharge curve estimation method comprising:
    performing initial function derivation processing of deriving and setting as a prior estimation function an appropriate curve of an initial open-end voltage function OCV(SOC) and initial impedance function Z(SOC) to be corrected a first time;
    performing stabilization processing of causing a battery temperature to agree with an ambient temperature;
    performing charge-discharge processing of discharging to a discharge lower limit voltage or charging to a charge upper limit voltage, the charge-discharge processing being performed after the stabilization processing;
    performing measurement processing of measuring, during the charge-discharge processing, a charge-discharge voltage $V_{meas}$ and a charge-discharge current I (defined as positive during charging and negative during discharging) in a cycle of a predetermined time and simultaneously calculating an SOC value which is a charging rate;
    performing voltage prior estimation processing of obtaining a prior estimation voltage value $\hat{V}^-(SOC)$ in accordance with the prior estimation function, based on the current value I and the SOC value, the voltage prior estimation processing being performed after the measurement processing;
    performing estimated error calculation processing of obtaining an estimated error $\tilde{V}$ between the measured voltage $V_{meas}$ and the prior estimation voltage value $\hat{V}^-(SOC)$;
    performing, based on the calculated error and the current value, posterior estimation calculation processing of obtaining as a posterior estimation value a posterior estimation open-end voltage value $\widehat{OCV}(SOC)$ and a posterior estimation impedance value $\hat{Z}(SOC)$ by correcting an open-end voltage value and an impedance value in accordance with correction expressions (1) and (2) using a Gaussian function with a predetermined learning rate $L_R$ and correction width σ

$$\widehat{OCV}(SOC) = \widehat{OCV}^-(SOC) + \tilde{V} L_R \exp\left\{-\frac{(SOC-\mu)^2}{2\sigma^2}\right\} \quad (1)$$

$$\hat{Z}(SOC) = \hat{Z}^-(SOC) + \frac{\tilde{V}}{I} L_R \exp\left\{-\frac{(SOC-\mu)^2}{2\sigma^2}\right\}, \quad (2)$$

where μ is a corrected peak top position of the Gaussian function and is an SOC value of a time when the measured voltage $V_{meas}$ is obtained;
    performing, based on the calculated posterior estimation value, posterior estimation approximate curve derivation processing of deriving a posterior estimation approximate curve of a new open-end voltage function and impedance function; and
    machine learning processing of setting the posterior estimation approximate curve as a new prior estimation function, repeating the measurement processing and the machine learning processing a predetermined number of times; and estimating a charge-discharge curve in accordance with $$V(SOC)=OCV(SOC)+IZ(SOC)$$

from the obtained approximate curve of the open-end voltage function and impedance function.

\* \* \* \* \*